United States Patent [19]
Nakatani et al.

[11] Patent Number: 5,869,903
[45] Date of Patent: Feb. 9, 1999

[54] SEALED SEMICONDUCTOR DEVICE INCLUDING OPPOSED SUBSTRATES AND METAL WALL

[75] Inventors: Mitsunori Nakatani; Hirofumi Nakano, both of Tokyo, Japan

[73] Assignee: Mitsubishi Denki Kabushiki Kaisha, Tokyo, Japan

[21] Appl. No.: 792,731

[22] Filed: Jan. 31, 1997

[30] Foreign Application Priority Data

Jul. 15, 1996 [JP] Japan ................................. 8-183902

[51] Int. Cl.⁶ .............................. H01L 23/48; H01L 23/52
[52] U.S. Cl. .......................... 257/777; 257/275; 257/704; 257/710; 257/778; 257/659; 257/660; 257/728; 333/247
[58] Field of Search ..................................... 257/728, 275, 257/699, 778, 777, 779, 787, 788, 789, 659, 660, 704, 710, 729; 333/246, 247

[56] References Cited

U.S. PATENT DOCUMENTS 5,117,068 5/1992 Seieroe et al. ............................ 257/728
5,175,611 12/1992 Richardson et al. ..................... 257/699
5,408,121 4/1995 Nakamura et al. ...................... 257/778
5,451,818 9/1995 Chan et al. .............................. 257/728
5,646,445 7/1997 Masumoto et al. ...................... 257/788

FOREIGN PATENT DOCUMENTS 349246  3/1991  Japan .
3268340 11/1991  Japan .
6236903  8/1994  Japan .

Primary Examiner—Carl W. Whitehead Jr.
Attorney, Agent, or Firm—Leydig, Voit & Mayer, Ltd.

[57] ABSTRACT

A semiconductor device includes a circuit substrate having a first surface on which a high-frequency circuit is located; a first metal layer disposed on a second surface of the circuit substrate; bump wirings on the first surface of the circuit substrate and electrically connected to the high-frequency circuit; a metal wall disposed on the first surface of the circuit substrate surrounding the high-frequency circuit; a wiring substrate having one surface on which substrate wirings corresponding to the bump wirings are located, the wiring substrate being disposed on the circuit substrate so that the substrate wirings are electrically connected to the bump wirings, and in contact with the metal wall, sealing a region including the high-frequency circuit; and a second metal layer disposed on a second surface of the wiring substrate. An electromagnetic shielding effect sufficient for use in a high-frequency circuit is obtained and fabricating cost is considerably reduced.

10 Claims, 9 Drawing Sheets

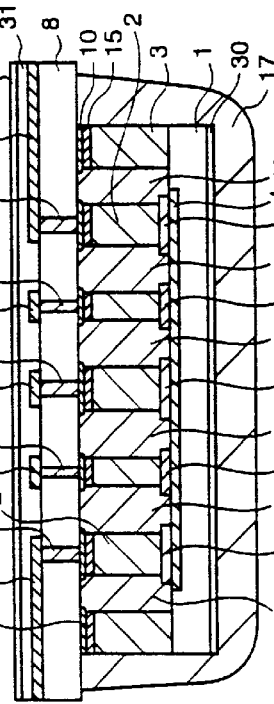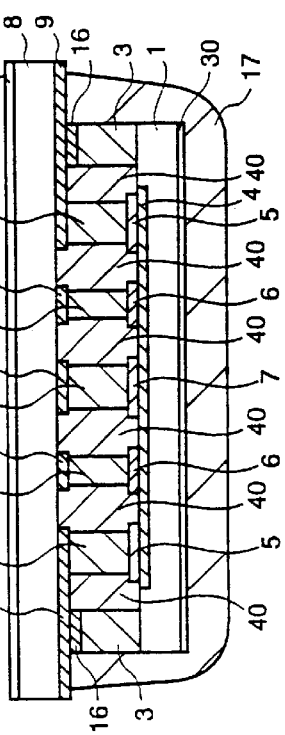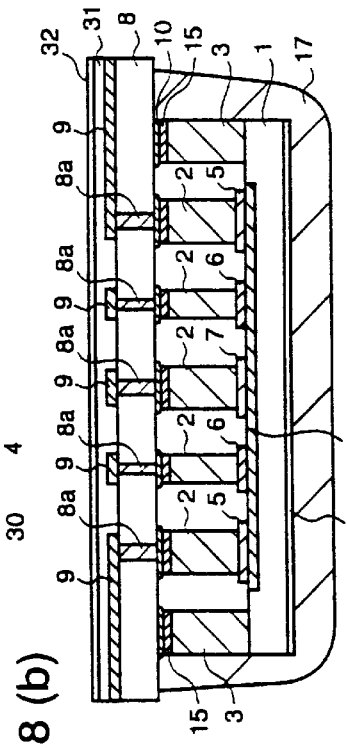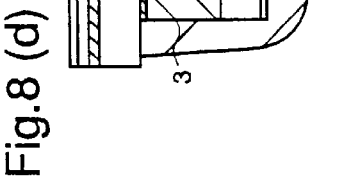

SEALED SEMICONDUCTOR DEVICE INCLUDING OPPOSED SUBSTRATES AND METAL WALL

FIELD OF THE INVENTION

The present invention relates to a semiconductor device and, more particularly, to a packaging of a semiconductor device including bump wirings.

BACKGROUND OF THE INVENTION

FIGS. 9(a) and 9(b) show a prior art semiconductor device in which a semiconductor chip having bump wirings is mounted on a TAB (tape automated bonding) tape or a printed board. In FIGS. 9(a) and 9(b), reference numeral 1 designates a substrate having a first surface where an active layer 4 is disposed. On the active layer 4, source electrodes 5, gate electrodes 6, and a drain electrode 7 are disposed, and these electrodes 5, 6, and 7 and the active layer 4 form a transistor. Reference numeral 2 designates bump wirings comprising Au, which are disposed corresponding to the respective electrodes 5, 6, and 7, and electrically connected to these electrodes. Reference numeral 8 designates a TAB tape or a printed board having a plurality of through-holes 8a. Wirings 9 are electrically connected to the bump wirings 2 through the through-holes 8a.

In the prior art semiconductor device, in order to achieve the maximum performance of the transistor, the wiring structure using the bump wirings 2 as described above is employed in a flip-chip mounting application. More specifically, the heat radiation effect in the transistor is increased by utilizing heat conduction of the bump wirings 2, and the wiring is laid out along the shortest distance from the electrodes of the transistor with the bump wirings 2, thereby reducing wiring delay.

In this structure, however, cavities are produced on the element surface and when the atmosphere of the element surface changes, the wirings are corroded. Further, ion migration occurs because of the difference in quality of the material between the wiring 9 and the bump wiring 2, so that the wirings are degraded. It is impossible to avoid the above-described problem, and this is a serious problem in view of reliability. Even if the chip shown in FIG. 9(b) is completely covered with resin, it is impossible to perfectly hermetically seal the chip, since adhesion or the like of the resin is limited. Consequently, the problem remains to be solved.

In addition, signal noise from the outside is picked up and noise is generated in peripheral circuits. Therefore, especially when an element comprises GaAs and is utilized in a microwave circuit for high frequency, there is a considerable problem.

As described above, in the prior art semiconductor device, corrosion and degradation of the wirings caused by cavities produced on the element surface cannot be avoided, whereby reliability of the device is not improved. In addition, when the element is utilized in a high-frequency circuit, noise is unfavorably picked up or adversely generated in peripheral circuits.

Japanese Published Patent Application No. Hei. 6-236903 discloses a semiconductor device including a metal layer serving as a ground electrode and disposed around an MMIC (monolithic microwave integrated circuit) chip. In this semiconductor device, noise is picked up from the outside through the metal layer, whereby the above-described problem remains to be solved. Further, Japanese Published Patent Application No. Hei. 3-49246 discloses a semiconductor integrated circuit in which a semiconductor chip is mounted on a substrate mounted on a film carrier through bump electrodes. A sealing portion comprising the same material as the bump electrode is provided on the surface of the semiconductor chip where elements are to be formed, along the circumference of the chip, so that the element forming-surface of the chip is hermetically sealed. In this structure, the elements and the wirings are protected from pollutants, such as moisture and impurity ions. Since this reference concerns a silicon device, however, a measure for preventing noise is not provided. Therefore, an electromagnetic shielding effect sufficient for use as a package of a microwave circuit is not obtained.

SUMMARY OF THE INVENTION

It is an object of the present invention to provide a semiconductor device that achieves an electromagnetic shielding effect sufficient for use in a high-frequency circuit and considerably reduces fabrication cost as compared with a prior art ceramic package.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a semiconductor device comprises a circuit substrate having a first surface on which a high-frequency circuit is provided; a first metal layer disposed on a second surface of the circuit substrate; bump wirings provided on the first surface of the circuit substrate and electrically connected to the high-frequency circuit; a metal wall disposed on the first surface of the circuit substrate surrounding the high-frequency circuit; a wiring substrate having one surface on which wirings corresponding to the bump wirings are provided, the wiring substrate placed on the circuit substrate so that the wirings are electrically connected to the bump wirings, and being in contact with the metal wall to seal a region where the high-frequency circuit is provided; and a second metal layer disposed on the other surface of the wiring substrate. Therefore, the electromagnetic shielding effect sufficient for use in a high-frequency circuit is obtained, and that fabricating cost is considerably reduced, as compared with a prior art ceramic package.

According to a second aspect of the present invention, in the semiconductor device, the wiring substrate is a TAB tape or a printed board.

According to a third aspect of the present invention, in the semiconductor device, the wirings provided on one surface of the wiring substrate are connected to the bump wirings through through-holes penetrating the wiring substrate, and the second metal layer is disposed on the wirings through an insulating layer.

According to a fourth aspect of the present invention, in the semiconductor device, a metal layer for adjusting the differences in height between the bump wirings and the metal wall is disposed between the bump wirings and the wirings, and between the metal wall and the wiring substrate. Therefore, even when the substrate surface has unevenness and the heights of the bump wirings and the metal wall are varied in fabrication, the sealing effect is reliably obtained.

According to a fifth aspect of the present invention, in the semiconductor device, the wirings provided on one surface of the wiring substrate are in contact with the bump wirings and electrically connected to the bump wirings, and an insulating layer is disposed between the metal wall and the wirings. Therefore, since there are no through-holes in the wiring substrate, the electromagnetic shielding effect is still more improved and the degree of freedom in layout of the wirings is increased.

According to a sixth aspect of the present invention, in the semiconductor device, cavities sealed by the circuit substrate, the wiring substrate, and the metal wall are filled with inert gas. Therefore, degradation of the elements is prevented, thereby improving reliability of the device.

According to a seventh aspect of the present invention, in the semiconductor device, cavities sealed by the circuit substrate, the wiring substrate, and the metal wall are filled with insulating resin. Therefore, degradation of the elements is prevented, thereby improving reliability of the device.

According to an eighth aspect of the present invention, in the semiconductor device, resin covers the second surface of the circuit substrate and the side surfaces of the metal wall. Therefore, the sealing effect is still more improved and the elements are protected from physical impacts.

According to a ninth aspect of the present invention, in the semiconductor device, the wiring substrate comprises a transparent material. Therefore, since it is possible to confirm that foreign substances get into the chip during the sealing, malfunction in operation after shipment due to the foreign material is prevented, thereby improving reliability of the semiconductor device.

BRIEF DESCRIPTION OF THE DRAWINGS

FIGS. 8(a)–8(f) are cross-sectional views each illustrating a semiconductor device in accordance with a sixth embodiment of the present invention.

DETAILED DESCRIPTION OF THE PREFERRED EMBODIMENTS

[Embodiment 1]

Figure 9:
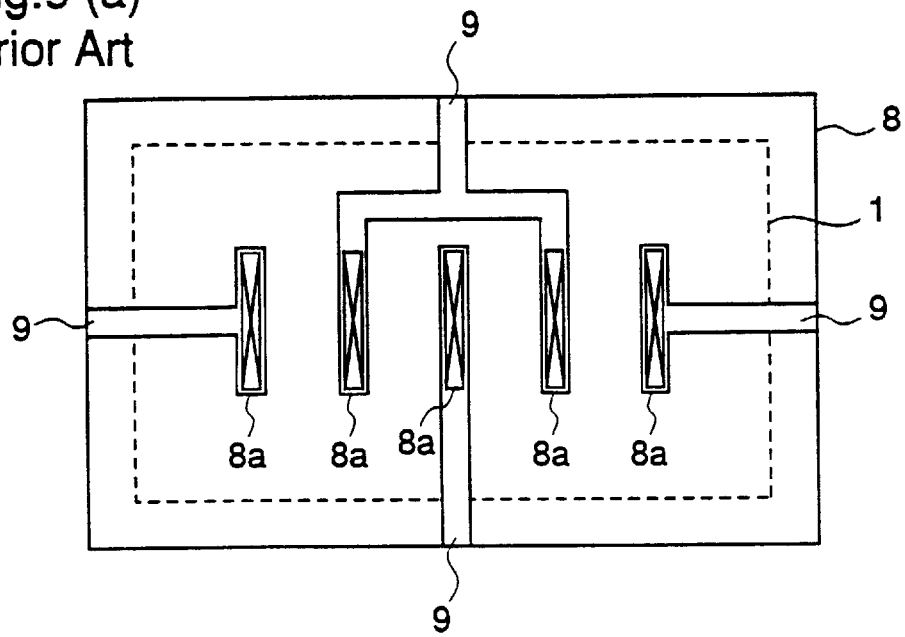
FIGS. 9(a) and 9(b) are a plan view and a cross-sectional view each illustrating a prior art semiconductor device.
Figure 9:
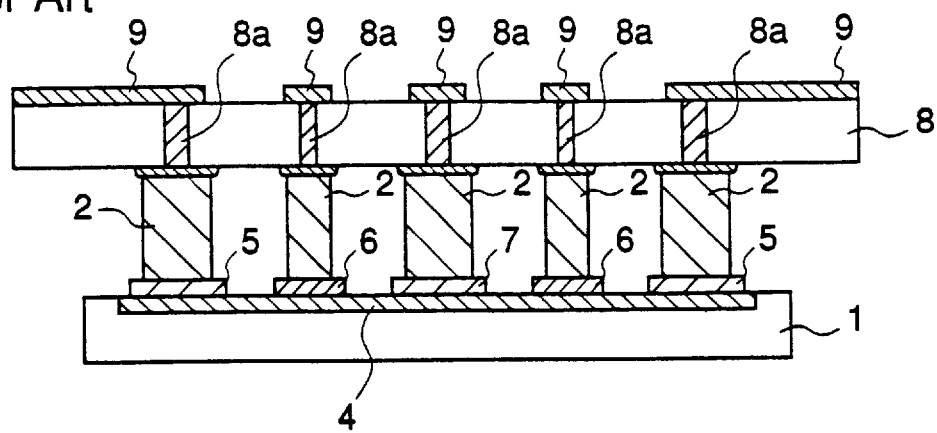

A description is given of a semiconductor device in accordance with a first embodiment of the present invention with reference to FIGS. 1(a), 1(b), 2(a)–2(c), and 4. In these figures, the same reference numerals as in FIGS. 9(a) and 9(b) designate the same or corresponding parts. Reference numeral 3 designates a metal wall comprising Au and surrounding a chip, numeral 10 designates an adhesive applied on the metal wall 3, and numeral 20 designates a cavity. Reference numeral 9a designates a part of a wiring 9, which is provided in a through-hole 8a penetrating a portion of a TAB tape or a printed board 8. Reference numeral 30 designates a metal layer disposed on a second surface of a substrate 1 opposite to a first surface where an active layer 4 is disposed, numeral 31 designates an insulating layer disposed on the surface of the TAB tape or the printed board 8 on which the wirings 9 are provided, and numeral 32 designates a metal layer disposed on the insulating layer 31.

Figure 1:
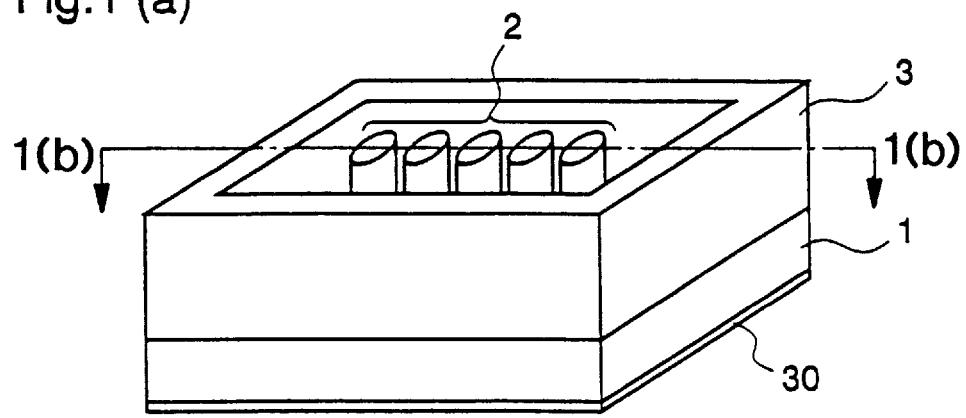
FIG. 1(a) is a perspective view for explaining a metal wall used for a semiconductor device in accordance with a first embodiment of the present invention.
FIG. 1(b) is a cross-sectional view taken along a line 1b—1b shown in FIG. 1(a).
Figure 1:
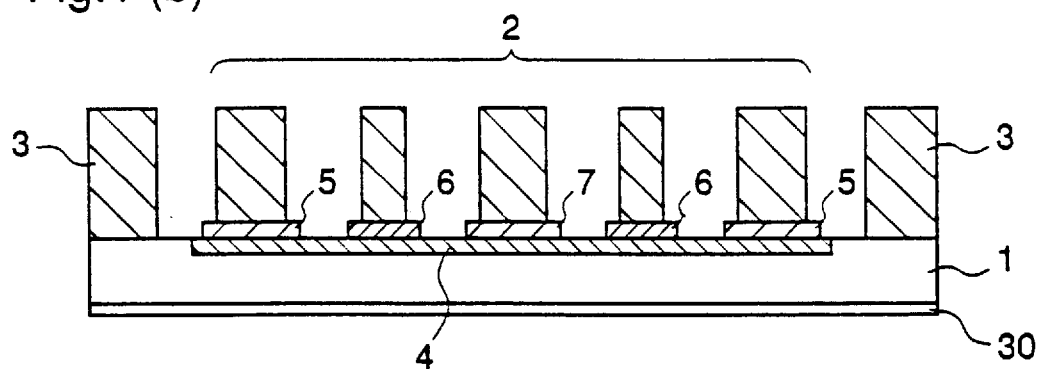
Figure 2:
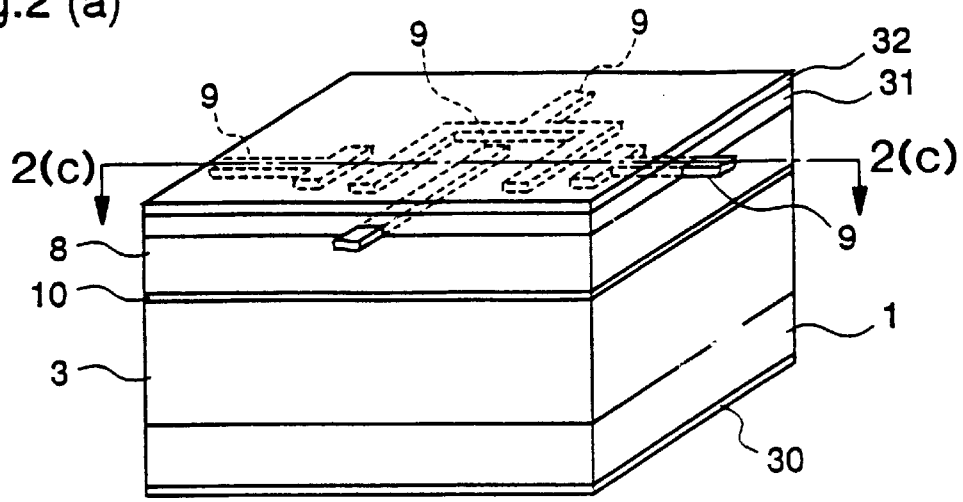
FIGS. 2(a)–2(c) are a perspective view, a plan view, and a cross-sectional view each illustrating the semiconductor device according to the first embodiment of the invention.
Figure 2:
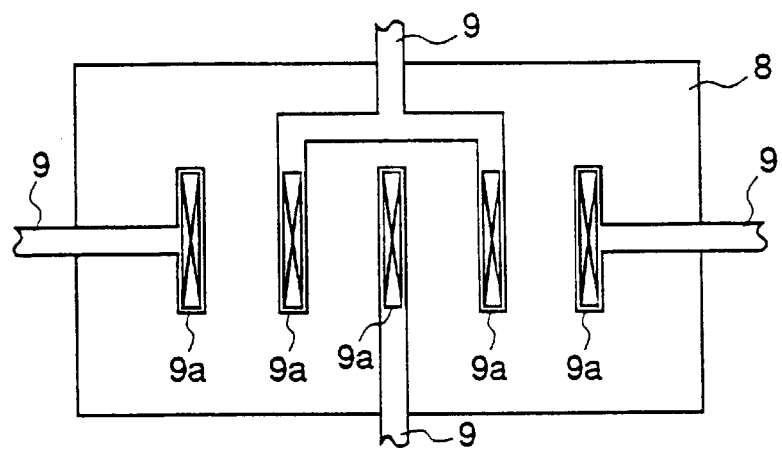
Figure 2:
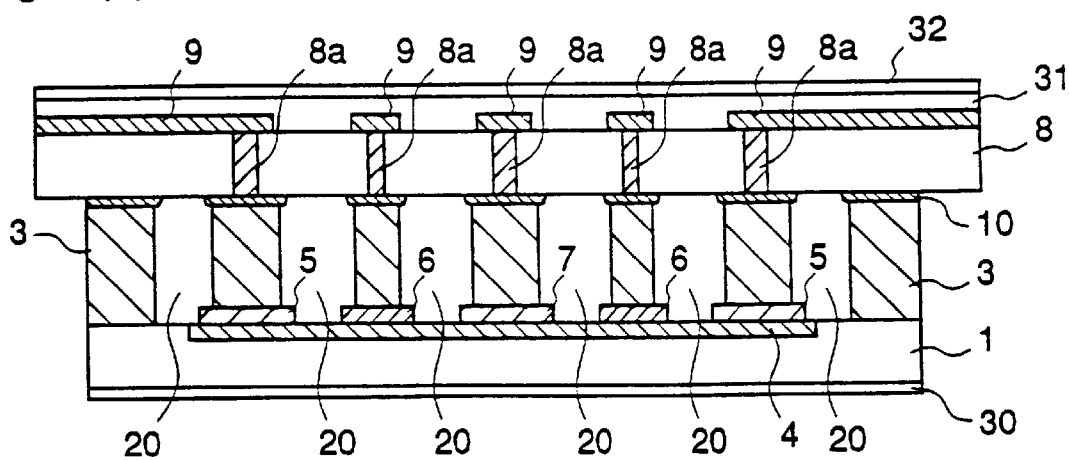

FIG. 1(a) is a perspective view illustrating a semiconductor chip having bump wirings 2 with the substrate 1 including the active layer 4 turned downward, and FIG. 1(b) is a cross-sectional view taken along a line 1b—1b in FIG. 1(a). The flip chip shown in FIGS. 1(a) and 1(b) is mounted by thermocompression bonding or the like on the TAB tape or the printed board 8 including the wirings 9 comprising Sn and the adhesive 10 that are previously processed, resulting in a structure as shown in FIGS. 2(a)–2(c). In FIG. 2(b), in order to easily understand the structure, the insulating layer 31 and the metal layer 32 are not shown.

A description is given of a method of fabricating the semiconductor chip shown in FIGS. 1(a) and 1(b). FIGS. 3(a)–3(d) are cross-sectional views illustrating process steps in the fabricating method.

Figure 3:
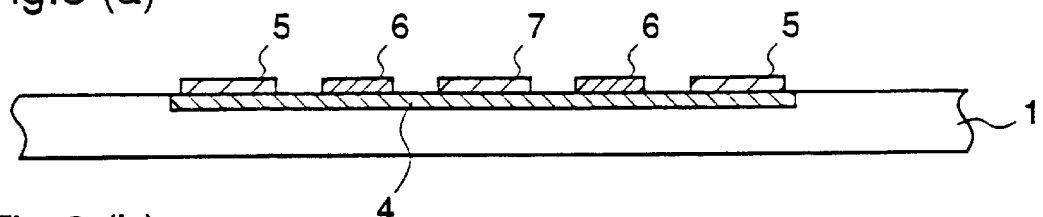
FIGS. 3(a)–3(d) are cross-sectional views illustrating process steps in a method of fabricating a semiconductor device according to the first embodiment of the invention.
Figure 3:
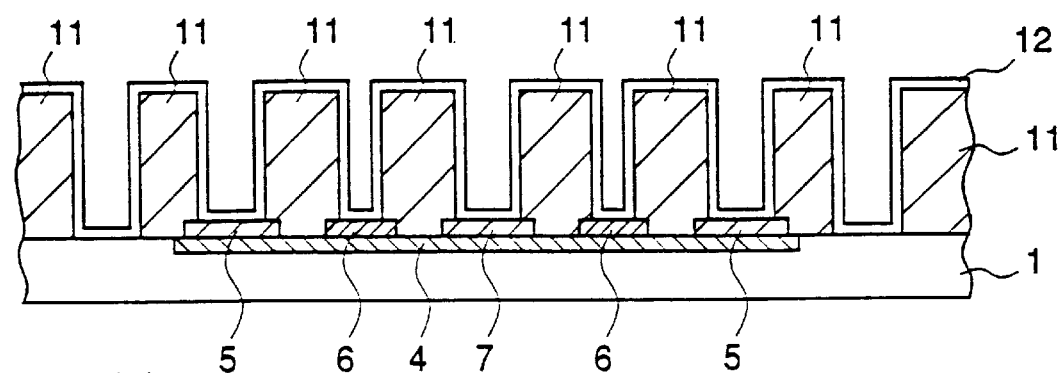
Figure 3:
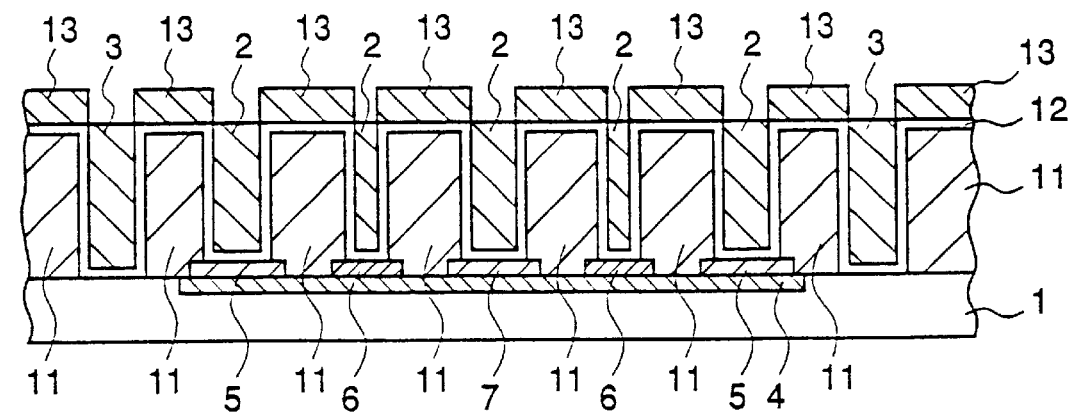
Figure 3:
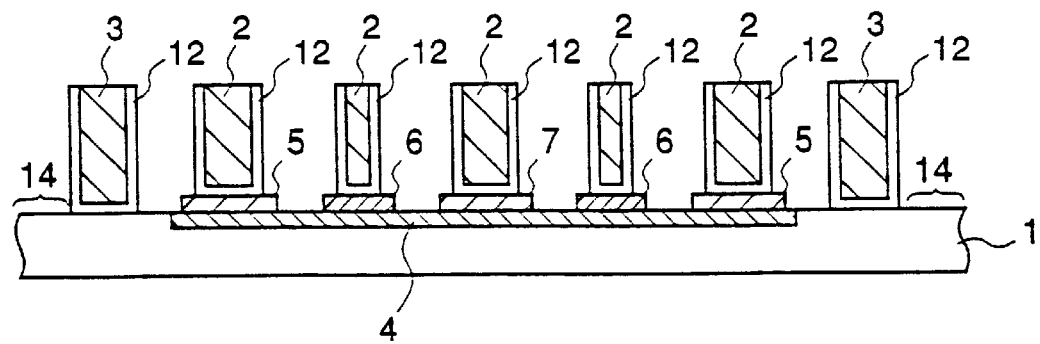

Initially, as shown in FIG. 3(a), a transistor comprising the active layer 4, the source electrodes 5, the gate electrodes 6, and the drain electrode 7 is formed on the first surface of the substrate 1 by ion implantation or the like.

Next, in the step of FIG. 3(b), pattern transfer of a resist 11 is performed by lithography, except for portions where the bump wirings 2 and the metal wall 3 are to be formed. Then, a feeding layer 12 for plating is deposited by sputtering or the like. The feeding layer 12 comprises a conductive film, such as Au and W, and is for electroplating, by the flow of an electrical current.

Subsequently, in the step of FIG. 3(c), pattern transfer of a resist 13 is performed where no plating has occurred, for plating thereby forming the bump wirings 2 and the metal wall 3. In this process, Au is used as the plating material.

Finally, as shown in FIG. 3(d), the resist 13, parts of the feeding layer 12, and the resist 11 are removed by $O_2$ ashing, plasma etching, and $O_2$ ashing, in this order.

Figure 4:
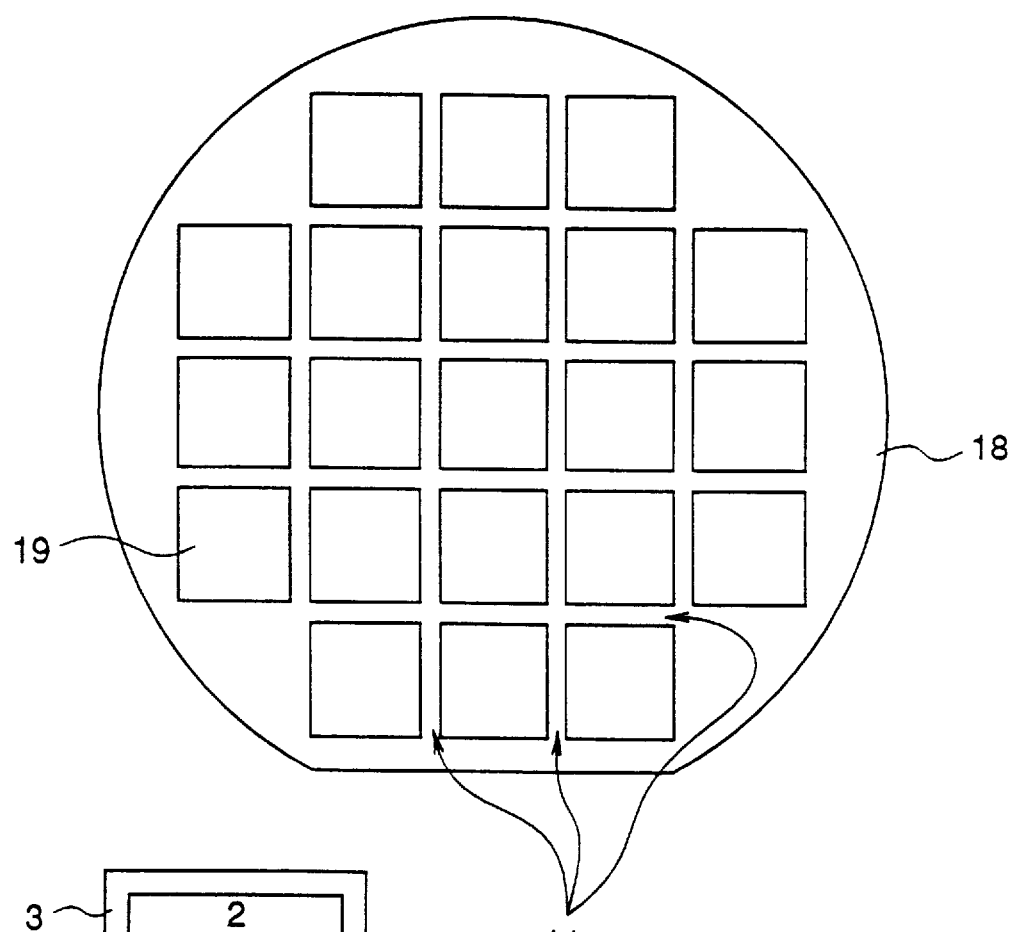
FIG. 4 is a diagram for explaining the semiconductor device in a wafer state according to the first embodiment of the invention.

Generally, when a semiconductor device is fabricated, a number of chips 19 are arranged on a wafer 18 as shown in FIG. 4. Therefore, chip separating portions 14 are required. The chip separating portions 14 are cut by etching or dicing, thereby obtaining the chip shown in FIG. 1(b).

Thereafter, the second surface of the substrate 1 is plated with Au to form the metal layer 30. Then, the TAB tape or the printed board 8 at which the wirings 9 and the adhesive 10 are previously processed is mounted on the substrate 1 shown in FIG. 3(d) by thermocompression bonding. Further, after the insulating layer 31 is deposited on the TAB tape or the printed board 8, the surface of the insulating layer 31 is plated with Au to form the metal layer 32, completing the semiconductor device as shown in FIGS. 2(a)–2(c). A material, such as AuSn, which melts at a temperature of about 300° C., at which the semiconductor device is not thermally degraded, is used for the adhesive 10.

According to the first embodiment of the invention, the cavities 20 opposite to a region where the active layer 4 is formed are completely isolated from the outside, i.e., hermetically sealed. Therefore, it is possible to protect the wirings and the elements from pollutants, such as moisture and impurity ions, thereby preventing degradation of the chip and realizing an improvement of reliability.

Since the wall surrounding the chip is electrically floating and the upper and lower surfaces of the chip are mostly covered with the metal layers 32 and 30, respectively, invasion of noise from the outside and radiation of noise to the outside are effectively prevented. Further, since the electromagnetic shielding effect is obtained with a simple structure as compared with a package employed in a general high-frequency circuit, the device is fabricated at low cost and the device size is reduced.

[Embodiment 2]

A description is given of a semiconductor device in accordance with a second embodiment of the present invention. In the semiconductor device having the structure as shown in FIG. 1(b), the substrate surface is uneven because the electrodes are formed on the surface of the active layer 4, and the heights of the bump wirings 2 and the metal wall 3 are unequal because of the difference in opening area when the bump wirings 2 are formed by sputtering. Therefore, even when the wiring pattern 9 of the TAB tape or the printed board 8 is connected to the bump wirings 2 using the adhesive 10 by thermocompression bonding as shown in FIG. 2(c), the wiring pattern 9 and the bump wirings 2 are not completely bonded to each other, so that sealing may be incomplete. In the second embodiment of the invention, in order to prevent incomplete sealing, AuSn used as the adhesive is laminated to a thickness more than the maximum difference between a reference value and the height of the bonding portion of the semiconductor chip shown in FIG. 1(b).

Figure 5:
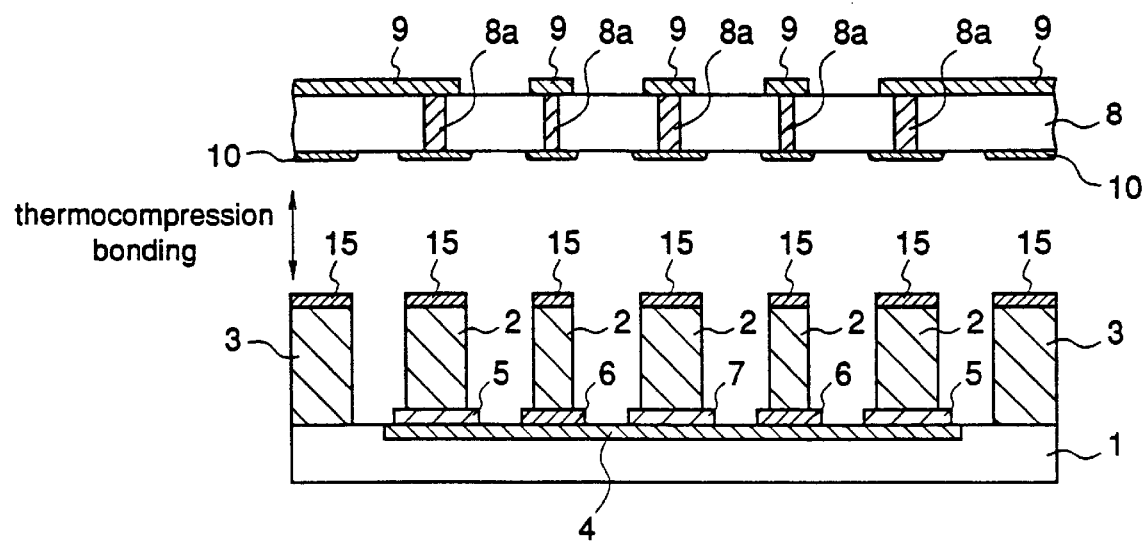
FIG. 5 is a cross-sectional view illustrating a semiconductor device in accordance with a second embodiment of the present invention.

After the plating in the fabricating process shown in FIG. 3(c) and the selective removal of the resist 13, an AuSn plating layer 15 is formed on the entire surface, thereby obtaining a semiconductor chip as shown in FIG. 5. The AuSn composition of the AuSn layer 15 is set to the AuSn eutectic ratio. Consequently, when the bump wirings 2 comprising Au and the wirings 9 comprising Sn are connected, transformation due to reflow at the thermocompression bonding is suppressed and short circuiting of the bump wirings 2 in the chip is prevented.

[Embodiment 3]

A description is given of a semiconductor device in accordance with a third embodiment of the present invention. In the first and second embodiments, the wirings 9 and the bump wirings 2 are connected through the through-holes 8a penetrating the TAB tape or the printed board 8. In this structure, however, the TAB tape or the printed board 8 is required to be processed, and further, layout of the wirings is complicated and the fabricating cost is high. Furthermore, since the through-holes 8a are provided, it is difficult to achieve satisfactory electromagnetic shielding of the interfaces between the through-holes 8a and the printed board 8.

Figure 6:
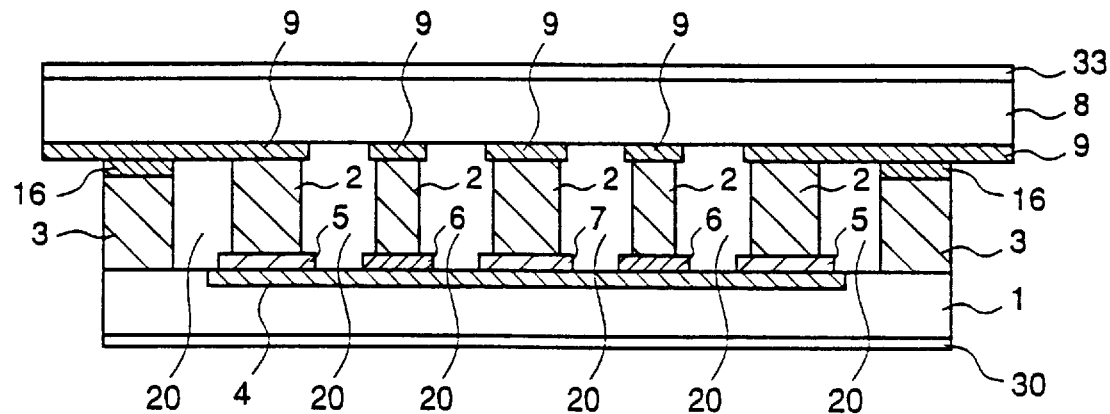
FIGS. 6(a) and 6(b) are a cross-sectional view and a plan view, each illustrating a semiconductor device in accordance with a third embodiment of the present invention.
Figure 6:
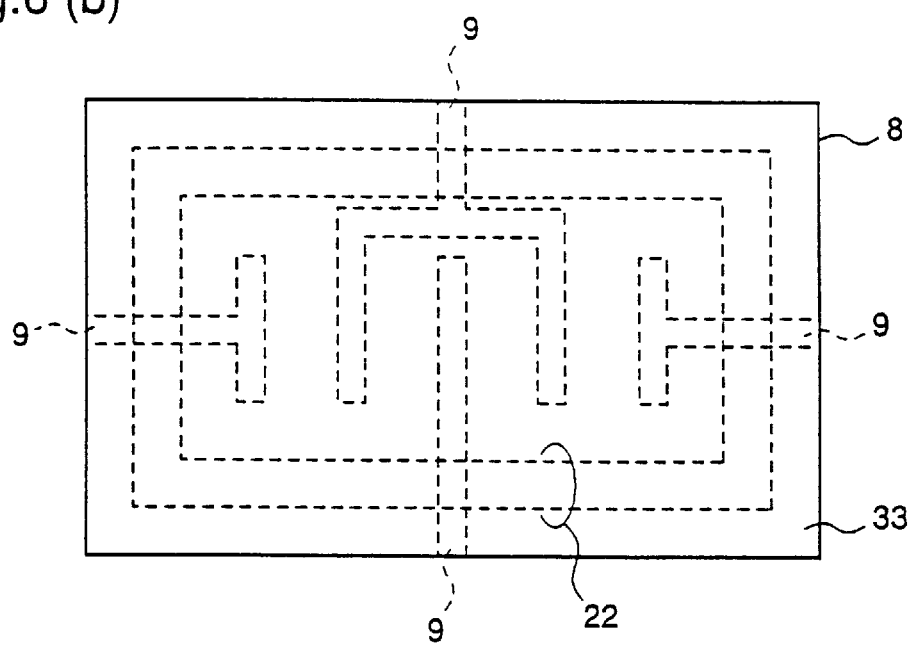

In the third embodiment of the invention, as shown in FIGS. 6(a) and 6(b), the wirings 9 are provided only on the first surface of the TAB tape or the printed board 8, which surface faces the chip, and insulating resin 16 is disposed between the wirings 9 and the metal wall 3. Further, a metal layer 33 is disposed on the entire second surface of the TAB tape or the printed board 8, opposite to the first surface. In addition, reference numeral 22 designates a region where the insulating resin 16 is disposed.

By using the structure as described above, the degree of freedom in design of the TAB tape or the printed board 8 is increased, and the formation of the insulating layer is unnecessary, whereby the fabricating cost is reduced, as compared with the first and second embodiments. Further, the electromagnetic shielding effect is improved because of the absence of through-holes.

[Embodiment 4]

A description is given of a semiconductor device in accordance with a fourth embodiment of the present invention. The semiconductor device according to the fourth embodiment is fundamentally identical to semiconductor devices according to the first to third embodiments, except that, when the chip is hermetically sealed in inert gas atmosphere, the cavities 20 in the chip are filled with the inert gas, such as nitrogen and argon, thereby improving reliability of the semiconductor device.

[Embodiment 5]

A description is given of a semiconductor device in accordance with a fifth embodiment of the present invention. The semiconductor device according to the fifth embodiment is fundamentally identical to the semiconductor devices according to the first to third embodiments, except that the cavities 20 are filled with a fluorine based resin or polyimide resin.

Figure 7:
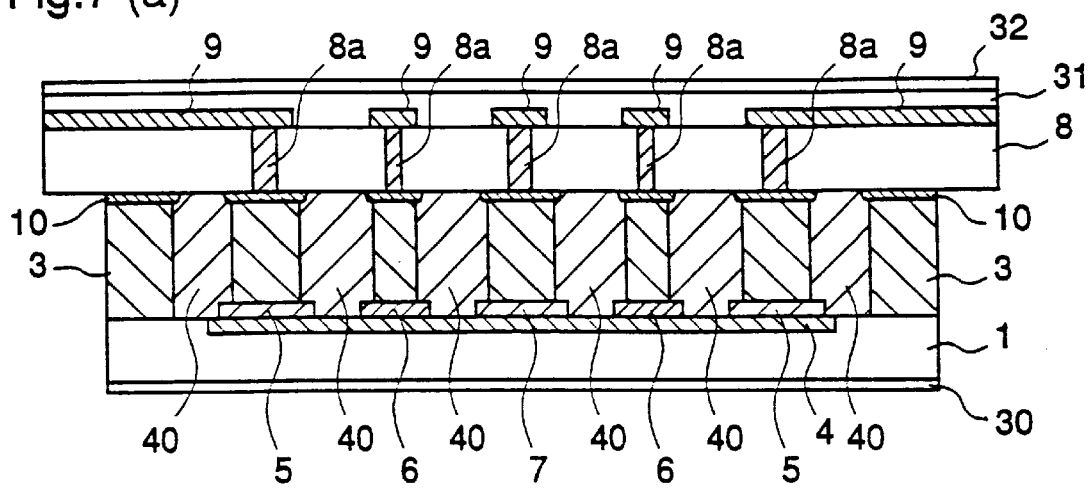
FIGS. 7(a)–7(c) are cross-sectional views each illustrating a semiconductor device in accordance with a fifth embodiment of the present invention.
Figure 7:
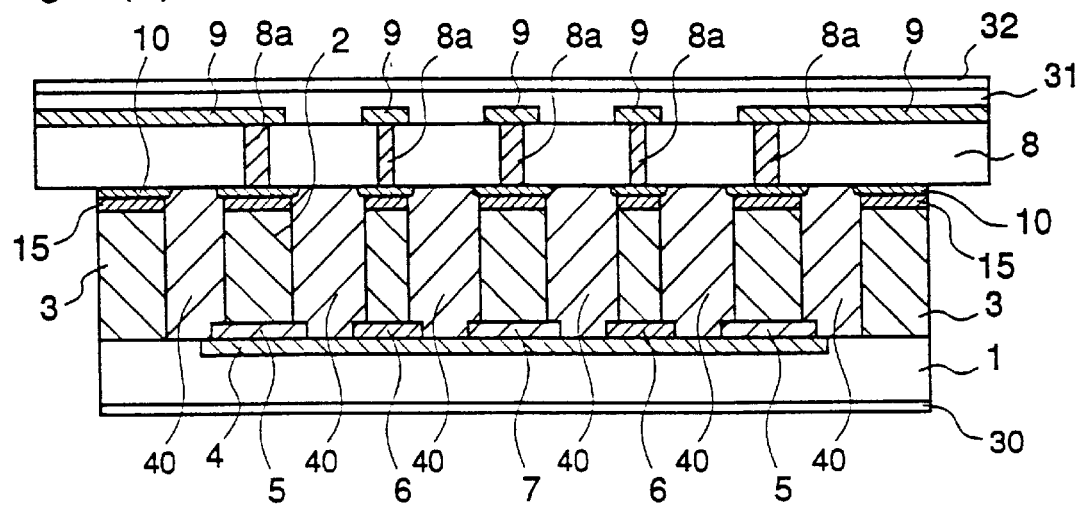
Figure 7:
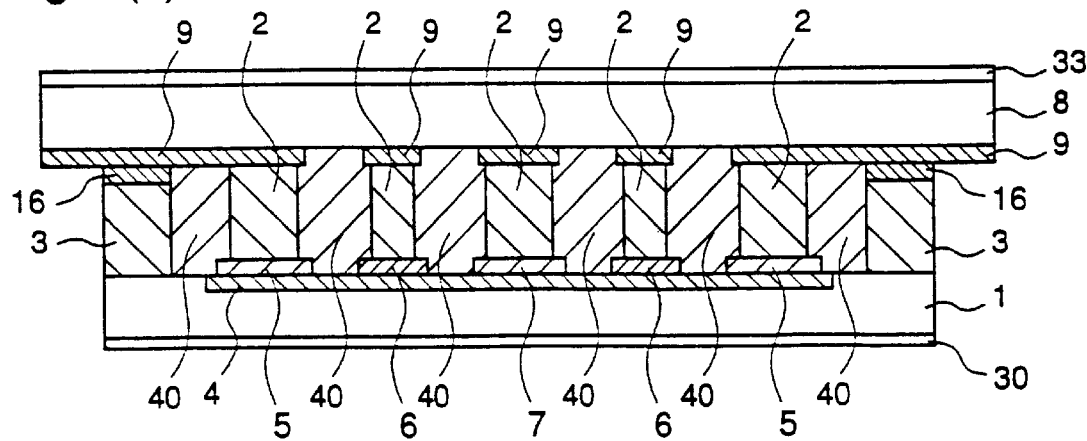

According to the fifth embodiment, as shown in FIGS. 7(a)–7(c), the cavities of the respective semiconductor devices according to the first to third embodiments are filled with fluorine based resin or polyimide resin 40, thereby obtaining high reliability. Especially, although there is a possibility that the sealing at the through-holes 8a may be incomplete in the first and the second embodiments, a highly reliable sealing effect can be obtained in this fifth embodiment.

In order to realize the high reliability sealing structure, for example, in a case of the semiconductor device shown in FIG. 7(a), a polyimide resin is used as the resist 11 for forming the feeding layer 12 for plating in the process shown in FIG. 3(b), and only the resist 13 and a portion of the feeding layer 12 directly beneath the resist 13 are removed, leaving the polyimide resin between the bump wirings 2 and between the bump wirings 2 and the metal wall 3 in the process shown in FIG. 3(c).

Alternatively, after the process step of FIG. 3(d), the polyimide resin is spin-coated, baked, and etched back, and then, the cavities are filled with the resin with the heights of the tops of the bump wirings 2 adjusted, completing the structure as shown in FIG. 7(a).

[Embodiment 6]

A description is given of a semiconductor device in accordance with a sixth embodiment of the present invention. The semiconductor device according to the sixth embodiment is fundamentally identical to the semiconductor devices according to the first to third, and fifth embodiments, except that resin 17 covers the second surface of the substrate 1 and the side surfaces of the metal wall 3, as shown in FIGS. 8(a)–8(f).

By using the structure as described above, the semiconductor device is completely sealed, and impacts on the transistor due to external stress are reduced.

[Embodiment 7]

A description is given of a semiconductor device in accordance with a seventh embodiment of the present invention. Generally, when foreign substances get into a device during sealing and it is not observed from the outside, defects are produced in the semiconductor device in operation, causing large loss. In order to avoid the problem, the semiconductor device according to the seventh embodiment, which is fundamentally identical to the semiconductor devices according to the first to six embodiments, uses a TAB tape or the printed board 8 that is a transparent material.

By using the structure as described above, in the respective embodiments, before forming the metal layer on the second surface of the TAB tape or the printed board 8, devices including foreign substances are found during a test. Therefore, it is possible to eliminate such defective devices, preventing loss due to the defects in the semiconductor devices after the shipment of the semiconductor devices.

While, in the respective embodiments of the invention, the metal layer 30 is disposed only on the second surface of the substrate 1, opposite to the first surface where the active layer 4 is disposed, the metal layer also may be disposed on the side surfaces of the substrate 1, connected to the metal wall 3, thereby further improving the electromagnetic shielding effect.

While, in the fifth embodiment of the invention, the cavities in the chip are filled with a fluorine-based resin or polyimide resin, an olefin-based resin and Spin-on Glass (SOG) may be employed with the same effects as described above.

While, in the respective embodiments of the invention, a semiconductor device in which the bump wirings are provided in the transistor part is given as example, a semiconductor device in which bump wirings for input and output of an IC (integrated circuit) are provided is also within the scope of the present invention.

What is claimed is:

1. A semiconductor device comprising:
   a circuit substrate having a first surface on which a high-frequency circuit is located;
   a first metal layer disposed on a second surface of the circuit substrate opposite the first surface;
   bump electrodes on the first surface of the circuit substrate and electrically connected to the high-frequency circuit;
   a metal wall disposed on the first surface of the circuit substrate surrounding the high-frequency circuit;
   a wiring substrate having a first surface on which substrate metallizations corresponding to the bump electrodes are located;
   a metal layer for adjusting differences in height between the bump electrodes and the metal wall, the metal layer being disposed between the bump electrodes and the wiring substrate metallizations, and between the metal wall and the wiring substrate, the wiring substrate being disposed opposite the circuit substrate so that the metallizations are electrically connected to the bump electrodes, the metal layer contacting the substrate metallizations and the metal wall, sealing a region including the high-frequency circuit; and
   a second metal layer disposed on a second surface of the wiring substrate opposite the first surface of the wiring substrate.

2. The semiconductor device of claim 1 wherein the wiring substrate is a TAB tape.

3. The semiconductor device of claim 1 wherein the substrate metallizations are connected to the bump electrodes through through-holes penetrating the wiring substrate, and including an insulating layer separating the second metal layer from the wiring substrate.

4. A semiconductor device comprising:
   a circuit substrate having a first surface on which a high-frequency circuit is located;
   a first metal layer disposed on a second surface of the circuit substrate opposite the first surface;
   bump electrodes on the first surface of the circuit substrate and electrically connected to the high-frequency circuit;
   a metal wall disposed on the first surface of the circuit substrate surrounding the high-frequency circuit;
   a wiring substrate having a first surface on which substrate metallizations corresponding to and in contact with the bump electrodes are located;
   an insulating layer disposed between the metal wall and the wiring substrate, sealing a region including the high-frequency circuit; and
   a second metal layer disposed on a second surface of the wiring substrate opposite the first surface of the wiring substrate.

5. The semiconductor device of claim 1 wherein cavities sealed by the circuit substrate, the wiring substrate, and the metal wall are filled with an inert gas.

6. The semiconductor device of claim 1 wherein cavities sealed by the circuit substrate, the wiring substrate, and the metal wall are filled with an insulating resin.

7. A semiconductor device including:
   a circuit substrate having a first surface on which a high-frequency circuit is located;
   a first metal layer disposed on a second surface of the circuit substrate opposite the first surface;
   bump electrodes on the first surface of the circuit surface and electrically connected to the high-frequency circuit;
   a metal wall disposed on the first surface of the circuit substrate surrounding the high-frequency circuit;
   a wiring substrate having a first surface on which substrate metallizations corresponding to the bump electrodes are located, the wiring substrate being disposed opposite the circuit substrate so that the substrate metallizations are electrically connected to the bump electrodes, and contacting the metal wall, sealing a region including the high-frequency circuit;
   a second metal layer disposed on a second surface of the wiring substrate opposite the first surface of the wiring substrate; and
   a resin covering the second surface of the circuit substrate and outside surfaces of the metal wall and contacting the first surface of the wiring substrate.

8. The semiconductor device of claim 1 wherein the wiring substrate comprises a transparent material.

9. The semiconductor device of claim 1 wherein the wiring substrate is a printed board.

10. A semiconductor device comprising:
    a circuit substrate having a first surface on which a high-frequency circuit is located;
    a first metal layer disposed on a second surface of the circuit substrate opposite the first surface;
    bump electrodes on the first surface of the circuit substrate and electrically connected to the high-frequency circuit;
    a metal wall disposed on the first surface of the circuit substrate surrounding the high-frequency circuit;
    a wiring substrate having a first surface on which substrate metallizations corresponding to the bump electrodes are located;
    a metal layer for adjusting differences in height between the bump electrodes and the metal wall, the metal layer being disposed between the bump electrodes and the wiring substrate metallizations, and between the metal wall and the wiring substrate, the wiring substrate being disposed opposite the circuit substrate so that the metallizations are electrically connected to the bump electrodes, the metal layer contacting the substrate metallizations and the metal wall, sealing a region including the high-frequency circuit;

an insulating layer disposed on the second surface of the wiring substrate opposite the first surface of the wiring substrate and on the first metal layer; and a second metal layer disposed on the insulating layer.

* * * * *